US012374483B2

(12) United States Patent
Xiao et al.

(10) Patent No.: US 12,374,483 B2
(45) Date of Patent: Jul. 29, 2025

(54) IMPLEMENTING COMPUTING FUNCTIONS USING SKYRMIONS

(71) Applicant: BROWN UNIVERSITY, Providence, RI (US)

(72) Inventors: Gang Xiao, Barrington, RI (US); Kang Wang, Providence, RI (US)

(73) Assignee: BROWN UNIVERSITY, Providence, RI (US)

( * ) Notice: Subject to any disclaimer, the term of this patent is extended or adjusted under 35 U.S.C. 154(b) by 258 days.

(21) Appl. No.: 18/102,887

(22) Filed: Jan. 30, 2023

(65) Prior Publication Data

US 2024/0258006 A1 Aug. 1, 2024

(51) Int. Cl.
| | |
|---|---|
| G06F 7/58 | (2006.01) |
| G11C 11/16 | (2006.01) |
| G11C 11/18 | (2006.01) |
| H01F 10/32 | (2006.01) |
| H03K 3/84 | (2006.01) |
| H10N 50/01 | (2023.01) |
| H10N 50/20 | (2023.01) |
| H10N 59/00 | (2023.01) |
| H03K 19/20 | (2006.01) |

(52) U.S. Cl.
CPC .......... *H01F 10/3254* (2013.01); *G06F 7/588* (2013.01); *G11C 11/1673* (2013.01); *G11C 11/18* (2013.01); *H03K 3/84* (2013.01); *H10N 50/01* (2023.02); *H10N 50/20* (2023.02); *H10N 59/00* (2023.02); *H03K 19/20* (2013.01)

(58) Field of Classification Search
CPC . H01F 10/3254; G06F 7/588; G11C 11/1673; G11C 11/18; G11C 11/1675; H03K 3/84; H03K 19/20; H10N 50/01; H10N 50/20; H10N 59/00
See application file for complete search history.

(56) References Cited

U.S. PATENT DOCUMENTS

| | | | | |
|---|---|---|---|---|
| 10,777,247 | B1 * | 9/2020 | Sun | ................ H10B 61/00 |
| 2016/0314827 | A1 * | 10/2016 | Cros | ................ G11C 11/16 |
| 2019/0074044 | A1 * | 3/2019 | Atulasimha | ......... G11C 11/5607 |
| 2021/0367602 | A1 * | 11/2021 | Kim | ................ G06F 7/501 |
| 2022/0359617 | A1 * | 11/2022 | Woo | ................ G06N 3/04 |
| 2022/0366955 | A1 * | 11/2022 | Wang | ................ G11C 11/1675 |
| 2022/0384717 | A1 * | 12/2022 | Kim | ................ H10N 52/00 |

(Continued)

OTHER PUBLICATIONS

Gruber R, et al. Skyrmion pinning energetics in thin film systems. Nat Commun. Jun. 6, 2022;13(1):3144. (Year: 2022).*

(Continued)

*Primary Examiner* — Hoai V Ho
*Assistant Examiner* — Justin Bryce Heisterkamp
(74) *Attorney, Agent, or Firm* — Tarolli, Sundheim, Covell & Tummino LLP (57) ABSTRACT

Systems and methods are provided that exploit local dynamics of a skyrmion to perform a computing function. A magnetic system hosts a skyrmion that transitions among a plurality of states, with each of the plurality of states having an associated switching probability. A bias source provides energy to the magnetic system as to adjust a switching probability associated with one of the plurality of states. A readout component measures a state of the skyrmion.

21 Claims, 4 Drawing Sheets

(56) References Cited

U.S. PATENT DOCUMENTS

2023/0006130 A1* 1/2023 Yang .................... G11C 11/161

OTHER PUBLICATIONS

Xueying Zhang, et al. ACS Applied Materials & Interfaces 2018 10 (19), 16887-16892. (Year: 2018).*
Li S. et al. Magnetic skyrmions for unconventional computing. Mater Horiz. Mar. 1, 2021;8(3):854-868. (Year: 2021).*
Liu et al., IEEE Trans. Circuits Syst. I, Reg. Papers 64, 133-144 (2017).
Yao et al., IEEE Trans. Electron Devices 67, 2553-2558 (2020).
Petrie et al., IEEE Trans. Circuits Syst. I, Fundam. Theory Appl. 47, 615-621 (2000); abstract.
Uchida et al., Nat. Photon. 2, 728-732 (2008).
Yang et al., IEEE J. Solid-State Circuits 51, 1022-1031 (2016).
Liu et al., Proc. IEEE 18th Int. Conf. Nanotechnol. (IEEE-NANO) 1-4 (2018); abstract.
Medlej et al Physica B: Condensed Matter vol. 579, Feb. 15, 2020, 411900.

* cited by examiner

IMPLEMENTING COMPUTING FUNCTIONS USING SKYRMIONS

STATEMENT REGARDING FEDERALLY SPONSORED RESEARCH OR DEVELOPMENT

This invention was supported by the National Science Foundation (NSF) under Grant No. OMA-1936221. The government has certain rights in this invention.

TECHNICAL FIELD

This disclosure relates generally to the field of electronic systems, and more particularly to implementing computing functions using skyrmions.

BACKGROUND

In-memory and unconventional computing architectures have received considerable interest for their power in solving problems that von Neumann computers fail to address efficiently. Spintronic systems are attractive for hardware implementations of low energy-consumption and high-speed computing architectures. Spintronic devices such as stochastic magnetic tunnel junctions (MTJs) and nano-oscillators have been proven useful in addressing the issues of optimization, invertible logic and recognition. However, it is challenging to integrate computing with data storage in a single silicon die and achieve efficient communications between them, owing to different structures or growing conditions for the separate parts.

SUMMARY OF THE INVENTION

In accordance with one aspect of the invention, a system is provided that includes a magnetic system hosting a skyrmion that transitions among a plurality of states, with each of the plurality of states having an associated switching probability. A bias source provides energy to the magnetic system as to adjust a switching probability associated with one of the plurality of states. A readout component measures a state of the skyrmion.

In accordance with another aspect of the invention, a method is provided. A magnetic system having a plurality of pinning sites is fabricated and a skyrmion is generated at one of the plurality of pinning sites. The skyrmion is generated as to be strongly pinned to the one of the plurality of pinning sites and weakly pinned to at least two other pinning sites of the pinning sites, with the skyrmion transitioning among a set of a plurality of states. Each of the plurality of states is associated with one of the at least two other pinning sites and has an associated switching probability. Energy is provided to the magnetic system as to adjust a switching probability associated with one of the plurality of states, and a state of the skyrmion is measured.

In accordance with one aspect of the invention, a system is provided that includes a magnetic system hosting a plurality of skyrmions. Each skyrmion transitions among a plurality of states, with each of the plurality of states having an associated switching probability. Each skyrmion is coupled to its neighboring skyrmions in their fluctuating dynamics. A bias source provides energy to a first subset of the plurality of skyrmions as to adjust a switching probability associated with at least one of the first subset of the plurality of skyrmions. A readout component measures a state a second subset of the plurality of skyrmions.

BRIEF DESCRIPTION OF THE DRAWINGS

The foregoing and other features of the present invention will become apparent to those skilled in the art to which the present invention relates upon reading the following description with reference to the accompanying drawings, in which.

DETAILED DESCRIPTION

Systems and methods are provided herein for a tunable skyrmion-based circuit element. This element can be used, for example, to develop a true random number generator (TRNGs), and in some examples, mutual communications are achieved between multiple skyrmion-based TRNGs. Fabricating a TRNG takes advantage of the local dynamic behavior of a skyrmion. In one example, the local dynamics is introduced by implementing local pinning centers with moderate pinning strengths in magnetic system hosting skyrmions. Mutual communication between multiple TRNGs is achieved by pushing skyrmions neighboring toward each other. Both the switching probability of a TRNG and dynamic coupling between multiple TRNGs are able to be effectively tuned, for example, by applied magnetic field and/or current. The combined features of local dynamics and dynamic coupling between neighboring skyrmions make skyrmions strong candidates for applications in logic devices, reservoir computing devices, and Ising computing devices, neuromorphic computing devices, tamper-resistant or tamperproofing devices, devices based on probabilistic computing, cryptographic devices that perform cryptographic functions (for example, random number generation, message authentication, digital signature generation, encryption, or key establishment). Efficiently controlling the switching probability and the dynamic coupling strength using a magnetic field, electrical current, and other means grants skyrmionic devices high tunability and reliably efficient controllability.

Examples of the systems and methods provided herein are disclosed in a paper, Wang, K., Zhang, Y., Bheemarasetty, V.

et al. Single skyrmion true random number generator using local dynamics and interaction between skyrmions. Nat Commun 13, 722 (2022), the entire contents of which, including its supplementary materials, is hereby incorporated by reference.

The term "skyrmion" is used herein to refer to any of a number of similar magnetic, topologically-stable solitons that exhibit spiral magnetism due to any of the Dzyaloshinskii-Moriya interaction, the double-exchange mechanism, or competing Heisenberg exchange interactions and have a topological charge of one or negative one. For the purpose of this disclosure, magnetic structures covered by the term "skyrmion" should be read to include at least Neel-type skyrmions, Bloch-type skyrmions, magnetic domain walls, antiskyrmions, intermediate skyrmions, higher-order skyrmions, bimerons, biskyrmions, skyrmion bundles, skyrmionium, ferromagnetic skyrmions, antiferromagnetic skyrmions, skyrmion tubes, chiral bobbers, a pair of Bloch and anti-Bloch points, hopfions, and trivial or nontrivial structures in optic, liquid crystal and other systems.

Magnetic skyrmions are topologically protected quasi-particles that can exist in certain magnetic materials. Magnetic skyrmions exhibit many desirable properties including stability, small size, and highly efficient controllability. Little experimental progress, however, has been reported in the implementation of skyrmionic devices owing to challenges in the precise control over skyrmion motion. Moreover, devices based on the skyrmion motion usually exhibit geometric and operational complexities. The systems and methods disclosed herein utilize the local dynamics of skyrmions, in contrast to the global dynamics of a skyrmion as a whole, to provide effective functionalities for versatile computing. The local dynamics of skyrmions can be introduced by local pinning centers which also enable the reliable positioning of skyrmions. These pinning centers can arise naturally in the sample growth process via intrinsic irregularities such as grain structures (e.g., with a size <100 nm) with local variations in magnetic properties. Additional artificial pinning centers can also be implemented experimentally by varying the film thickness in different regions. Intriguing features of skyrmions include their mobility in magnetic films and their mutual interactions which may provide additional functionalities.

Figure 1:
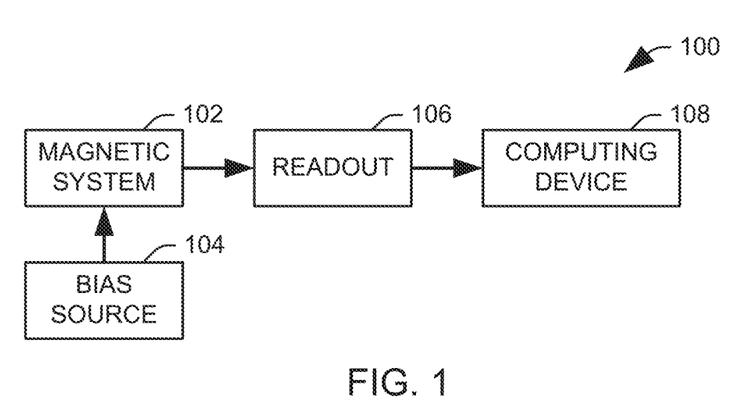
FIG. 1 illustrates a system incorporating a skyrmion hosted in a magnetic system such that the skyrmion can switch between a plurality of states with a tunable switching probability.

FIG. 1 illustrates a system 100 incorporating a skyrmion hosted in a magnetic system 102 such that the skyrmion can switch between a plurality of states with a tunable switching probability. In various embodiments, the magnetic system 102 can be implemented using one or more of a bulk material, a thin film, or other micro-constricted or nano-constricted structures. Bulk materials used for hosting skyrmions can include bulk magnets with either chiral, polar, or $D_{2d}$ symmetry such as MnSi, FeGe, MnGe, $Fe_{1-x}Co_xSi$, $Mn_{1-x}Fe_xSi$, $Mn_{1-x}Fe_xGe$, $Cu_2OSeO_3$, Co—Zn—Mn alloy, $GaV_4S_8$, $VOSe_2O_5$, magnetically frustrated materials with achiral lattices and competing interactions such as $Gd_2PdSi_3$ and $CaBaCo_2Fe_2O_7$, ferrimagnetic materials, and antiferromagnetic materials.

Magnetic thin films hosting skyrmions can include a single magnetic layer or multiple magnetic layers. In various embodiments, magnetic multilayers can include ferromagnetic multilayers, ferrimagnetic multilayers, antiferromagnetic, or altermagnetic multilayers, and can be metallic, semiconducting, or insulating. The magnetic layers can be coupled via a demagnetization field or interlayer exchange coupling through layers between the magnetic layers. Where a thin film is used, it can include a non-magnetic layer structure providing an interfacial Dzyaloshinskii-Moriya Interaction (DMI) that stabilizes skyrmions, a magnetic layer that is sandwiched by a non-magnetic layer and an oxide layer, an oxide layer determining the perpendicular magnetic anisotropy (PMA) of the magnetic layer, and a capping layer used to prevent underlying layers from further oxidization and degradation on exposure to the atmosphere.

The local dynamics of skyrmions can be introduced by implementing local pinning centers by modifying the multilayer structure and growth conditions to manipulate pinning centers that arise naturally in the sample growth process. Alternatively or additionally, the local dynamics of skyrmions can be introduced by implementing local pinning centers by modifying post-growth processing processes such as the annealing process to manipulate naturally-existing pinning centers. The local dynamics of skyrmions can also be introduced by implementing artificial local pinning centers, which can be generated by introducing holes in multilayers, modulating sample thickness, embedding impurity atoms in the multilayers, or via adatoms adhering to the sample surface. Artificial local pinning centers can also be generated by using localized strain, voltage, current, optics, or bombardment of the material with energetic particles (e.g., photons, ions, electrons, atoms, molecules, etc.) to modify the spatial variations in magnetic properties. In various embodiments, the local dynamics of skyrmions is introduced by implementing random or regular pining systems (e.g., in the geometry of a circle, ellipse, square, rectangle, triangle, parallelogram, pentagon, hexagon, octagon, kite, or similar shape etc.) or other controls to modify the spatial variations in magnetic properties.

For example, magnetic skyrmions can be transformed from a labyrinthine domain phase by either increasing or decreasing an applied magnetic field. In addition to the magnetic field, a spin current can also lead to the transformation from a labyrinthine domain phase to the state with multiple skyrmions. Multiple skyrmions can be created by the combined effects of the magnetic field and the spin current. Skyrmions are nucleated at pinning centers and their distributions may differ from the application of one current pulse to another. Due to spatial non-uniformities of the pinning strengths, the critical current or the field required for escape from the pinning centers varies for different skyrmions. To focus on a particular skyrmion, multiple skyrmions can be nucleated in which the targeted skyrmion exists and other skyrmions can be removed, or annihilated, by applying different currents or by varying the external field.

In one example, the skyrmion interacts with local pinning centers such that a first pinning center strongly pins one part of the skyrmion while the other part can fluctuate in time between two or more weaker pinning sites under thermal effects. Depending on the number and positioning of the weaker pinning centers, the fluctuation of the skyrmion can occur between two discrete states, three discrete states, or four or more discrete states. Skyrmions can be generated or annihilated within the magnetic system 102 by modifying an applied magnetic field, either uniformly or local to the pinning site, applying an electric current (DC, AC, or RF), applying a voltage (DC, AC, or RF), applying a spin wave, applying a magnon pulse, applying an acoustic wave, using optics or applying photons either uniformly or local to the pinning site, applying a thermal pulse either uniformly or local to the pinning site, applying an gradient of any external stimulus, or via other, similar, controls. Skyrmions induced in the magnetic system 102 can vary in size between one-tenth of a nanometer to one hundred micrometers.

In one example, the magnetic system 102 is implemented as a magnetic multilayer of a substrate Ta(1.6 nm)/

$Co_{40}Fe_{40}B_{20}$(CoFeB)(0.95 nm)/MgO(1.6 nm)/TaO$_x$(2.0 nm). The magnetic multilayer is deposited on thermally oxidized silicon wafers using a high-vacuum magnetron sputtering system with a base vacuum pressure of $5.0 \times 10^{-8}$ Torr. The MgO layer is deposited using radio-frequency (RF) power with an argon pressure of 0.7 mTorr while other layers are deposited using DC power with an argon pressure of 1.4 mTorr. Fifteen watts of DC power is used for the deposition of the ferromagnetic CoFeB layer and a lower DC power (three watts, four watts, and five watts) for the deposition of the Ta layers. The DC power for the Ta-layer deposition is regulated to implement moderate pinning of magnetic skyrmions. This magnetic multilayer hosts skyrmions with a large size (diameter 1.0-2.2 μm) compared to the size of pinning centers.

To implement moderate pinning strengths, the sputter rate of the Ta layer is controlled by regulating the DC power for deposition, to provide uniformity of the interfacial perpendicular magnetic anisotropy (PMA) and Dzyaloshinskii-Moriya interaction (DMI). A slower sputter rate induces strong pinning of magnetic skyrmions whereas skyrmions in magnetic films grown with a higher sputter rate are able to move freely under thermal effects. Due to the inherent spatial non-uniformities of pinning strengths, magnetic films with moderate growth conditions host skyrmions in which one part of the skyrmion is pinned strongly while the rest of it fluctuates in time between two weaker pinning centers. In one example, the samples are patterned into Hall crosses with dimensions of 20×20 μm$^2$ using photolithography and physical ion milling. The samples are then annealed at different temperatures in a high-vacuum chamber with a vacuum pressure of approximately $1.0 \times 10^{-6}$ Torr in the presence of a magnetic field of about 0.4 T normal to the sample plane. In this example, the state of the skyrmions can be measured either through direct imaging using a polar-magneto optic Kerr effect (p-MOKE) microscope or through Hall-resistivity measurements using a Hall cross with dimensions 20×20 μm$^2$. The Hall resistivity $P_{xy}$ is dominated by the anomalous Hall resistivity which is proportional to the perpendicular magnetization while the ordinary and topological Hall resistivities are negligible in comparison.

A bias source 104 provides energy to the magnetic system as to adjust a switching probability associated with one of the plurality of states associated with the skyrmion. It will be appreciated that a base switching probability of the skyrmion can be determined, for example, by varying the temperature, modifying the spatial distributions of pinning centers and pinning strengths, modifying a configuration of the skyrmion, or modifying a size of the skyrmion. As part of tuning the base switching probability, the skyrmions can be selected to have a diameter selected to be either between 0.1 to 1 nm, between 1 to 10 nm, between 10 to 100 nm, between 100 to 200 nm, between 200 to 500 nm, between 500 nm to 1 μm, between 1 to 2 μm, between 2 to 5 μm, between 5 to 10 μm, or between 10 to 100 μm. The bias source 104 can provide any of an applied magnetic field, a current, a voltage, a magnon wave or pulse, a thermal pulse, a gradient of a stimulus, or similar controls to tune the switching probability associated with a state of the skyrmion to a desired value. In one implementation, the switching probability can be tunable to provide a switching fluctuation rate for the skyrmion within the range of $10^{-2}$ to $10^{12}$ hertz.

In one implementation, the magnetic system 102 is placed on a printed circuit board (PCB) and is connected to the PCB using a wire-bonder machine. The bias source 104 includes a polyimide flexible heater placed on the bottom of the PCB to heat the magnetic system 102, with a thermal via is introduced in the PCB to enhance the thermal conductivity between the heater and the magnetic system. The bias source 104 further comprises an electromagnet or coil(s) placed under or above the PCB is used to supply a perpendicular magnetic field. In one implementation, the temperature and the magnetic field can be detected via a temperature sensor and a Hall sensor, respectively, which are both placed close to the magnetic system on the PCB. While this example uses current, temperature, and an applied magnetic field to adjust the switching probability of the skyrmion, it will be appreciated that similar local dynamics of skyrmions can be observed in various magnetic systems such as ferrimagnets, where a magnon wave or pulse serves as a more energy-efficient control.

A readout component 106 is configured to measure a state of the skyrmion. The readout component 106 can utilize any of anomalous or regular Hall-effect electronic measurement, tunneling magnetoresistance measurement, anomalous tunneling magnetoresistance measurement, spin Hall magnetoresistance, anisotropic magnetoresistance measurement, or another magnetoresistance measurement. The readout component 106 can also utilize direct magnetic imaging using a magnetic microscope such as p-MOKE, a Lorentz transmission electron microscope, nitrogen-vacancy center magnetometry, a scanning tunneling electron microscope, a scanning magnetic microscope using individual or arrayed solid-state magnetic sensors, or x-ray magnetic microscopy. In other implementations, the readout component 106 can use a spin Seebeck effect or a localized sensor or sensors based on magnetoresistance, spin-polarized tunneling, induction, quantum interference, or other physical mechanisms. The output of the readout component 106 can be provided, for example, as an output voltage or as imaging contrast in selected regions of an image.

In one example, the state of the skyrmion can be measured through Hall-resistivity measurements using a Hall cross. Electronic signals generated by measuring Hall voltages which are intensified through amplifiers, with the amplified signals from two independent amplifiers are converted to digital signals through a high-speed data acquisition (DAQ) device with a sixteen-bit resolution and a high sample rate of two MS/s. A digital low-pass filter at one hundred Hz is applied to the averaged signals from the two channels to minimize noise. This electronic method allows us to detect electronic signals from a single skyrmion. In this example, readout can be improved by reducing the active sensing area relative to the skyrmion size or increasing the skyrmion-size variation in fluctuation dynamics.

In some implementations, a computing device 108 receives the output of the readout component 106 and performs at least one function based upon the output of the readout component. It will be appreciated that the computing device 108 can be implemented as dedicated hardware, such as an integrated circuit or field programmable gate array, as software instructions executed by a processor with appropriate hardware for receiving the output of the readout device, or as a combination of software and dedicated hardware. The computing device 108 can include, for example, a memory, a logic gate or set of logic gates, a reservoir computing system, an Ising computing system, a neuromorphic computing system, a cryptographic system, a probabilistic computing system, a random number generator, a digital tamperproofing system, or an approximate computing system.

The fluctuation rate between the two states of a skyrmion determines the operation speed of skyrmionic devices, with the average residence time decreasing with increasing temperature. In addition to bringing about thermal activation, the temperature also affects magnetic properties of the magnetic thin film. Parameters such as saturation magnetization $M_S$, exchange stiffness A, DMI $D_{int}$, and PMA $K_u$ decrease with increasing temperature as indicated by the scaling $M_S = M_S(0)[1-(T/T_0)^\alpha]$, $A \propto M_S^\beta$, $D_{int} \propto M_S^\gamma$, and $K_u \propto M_S^{n(n+1)/2}$ where $\alpha=3/2$ and $\beta=\gamma=2$ in a mean-field approximation, and n=2 is the dimensionality of the magnetic film. Correspondingly, the spatial variation in any one parameter is expected to be reduced at an elevated temperature, reducing the energy barrier ΔE between two skyrmion states. According to Arrhenius law $f=f_0 \exp(-\Delta E/k_B T)$, assuming a constant attempt frequency $f_0$, both an increase in the thermal activation energy $k_B T$ and reduction in ΔE would cause a faster fluctuation rate. The attempt frequency, however, may carry an activation entropy and can be expressed by $f_0 = f_{00} \exp(\Delta E/E_0 + b)$ if the Meyer-Neldel rule applies. Here, $E_0$, is a characteristic energy, $f_{00}$ is a positive prefactor, and b is a constant. In this scenario, the fluctuation rate may have a weaker energy-barrier dependency.

In addition to increasing the thermal activation energy and reducing the energy barrier between two skyrmion states, reducing the distance Δq between two weaker pinning sites may also increase the fluctuation rate. This is a result of the entropic effect which implies that a longer path must be explored more randomly while the energy barrier may remain the same. From micromagnetic simulations using grains with an average size of 10 nm and random distributions of the interfacial PMA and DMI, an average residence time as low as thirty ns can be achieved for the mobile part of the skyrmion fluctuating in time between two pinning centers that are separated by approximately 50 nm. In this simulation, the random PMA variation is set at $$\frac{\Delta K_u}{K_u} = 7\%$$

and the random DMI variation is set at $$\frac{\Delta D_{Int}}{D_{Int}} = 21\%.$$

Thermal fluctuations at 300 K are accounted for by adding a stochastic thermal field into the Landau-Lifshitz-Gilbert equation. The inventors have thus determined that a fluctuation rate beyond the MHz range can be achieved by more elaborate control of the energy landscape such as through the implementation of artificial pinning centers which can arise from thickness modulations, voids in multilayers, embedded impurity atoms or adatoms adhering to the surface formed with advanced thin film fabrication, lithography, irradiation, ion implantation, or laser ablation techniques.

In one implementation, a single, isolated skyrmion can be used to provide a robust true random number generator (TRNG) for probabilistic computing. Both the field and current are efficient parameters to control the switching probability of the probabilistic bit. In this example, the computing device 108 can include a NMOS transistor used to restrict the current applied to the system and a comparator used to convert output signals to logical bits. A microcontroller can used to read output signals from comparators and implement appropriate synaptic weights. A data acquisition (DAQ) board can be used to communicate with the microcontroller and convert the results into analogue voltages. A TRNG based on the local dynamics of a single skyrmion is spatially compact and eliminates the need for a reshuffle device in probabilistic computing. Furthermore, magnetic skyrmions are superior to other stochastic neurons, as modelled by stochastic MTJs, as they possess novel characteristics including the ability to move between sites, reverse polarities and interact with other neighboring skyrmions in addition to a high sensitivity of the switching probability to an applied magnetic field and current. With the use of systems based on the local dynamics of skyrmions, as described herein, optimization problems such as integer fractionalization and invertible logics that von-Neumann computers cannot efficiently address may be resolved.

Figure 2A:
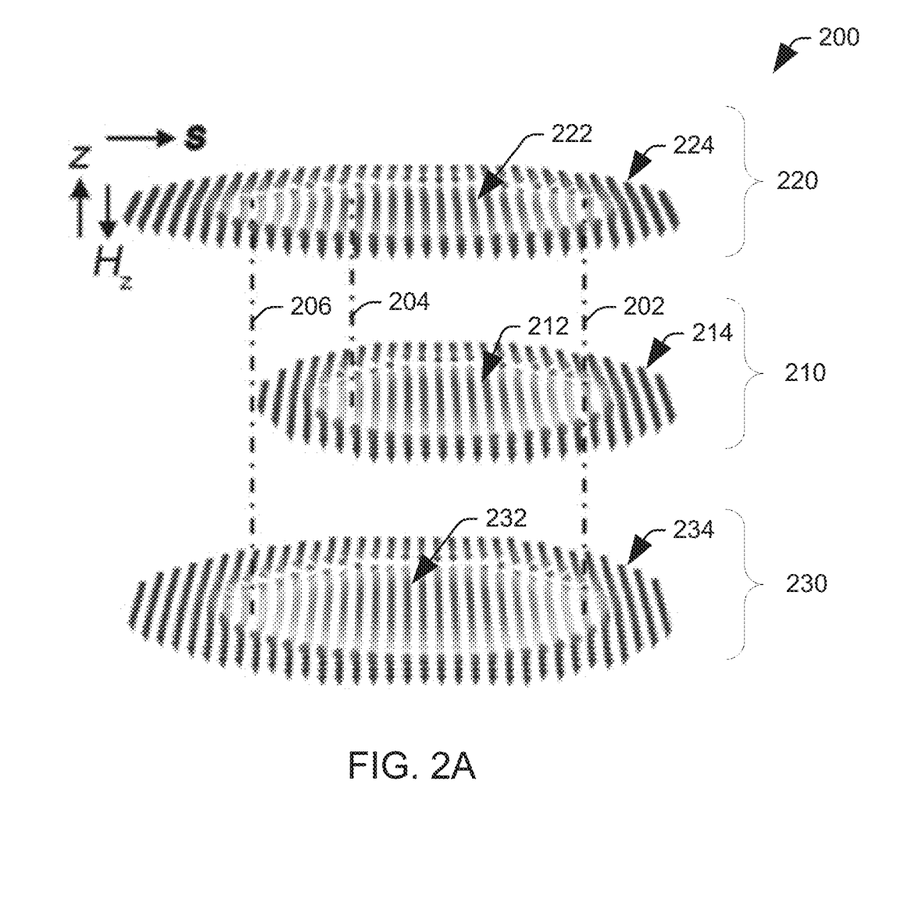
FIG. 2A is a graph of fluctuations of an isolated skyrmion interacting with local pinning centers in time between a first state and a second state.

One possible case of a skyrmion interacting with local pinning centers is schematically presented in FIG. 2 in which a pinning center 202 strongly pins one part of the skyrmion while the other part under thermal effects can fluctuate in time between two weaker pinning sites 204 and 206. FIG. 2A is a graph 200 of fluctuations of an isolated skyrmion interacting with local pinning centers 202, 204, and 206 in time between a first state 210 and a second state 220 and 230. These two states, which we refer to as the small-skyrmion (S) 210 and large-skyrmion (L) 220 and 230 states occur at local minima in the energy landscape separated by an energy barrier. In the illustrated implementation, darker arrows on the periphery 212, 222, and 232 of each skyrmion state correspond to upward orientations of magnetization (−z axis), whereas darker arrows in the center 214, 224, and 234 of each skyrmion state represent downward orientations of magnetization (z axis). It will be appreciated that a random number generator using a skyrmion with two weaker pinning centers, as displayed in FIG. 2A, can generate a single random bit per measurement of the skyrmion state. Where more than two weaker pinning centers are used to provide additional states for the skyrmion, additional bits can be generated. For example, a skyrmion with four possible states can provide two bits per measurement.

Figure 2B:
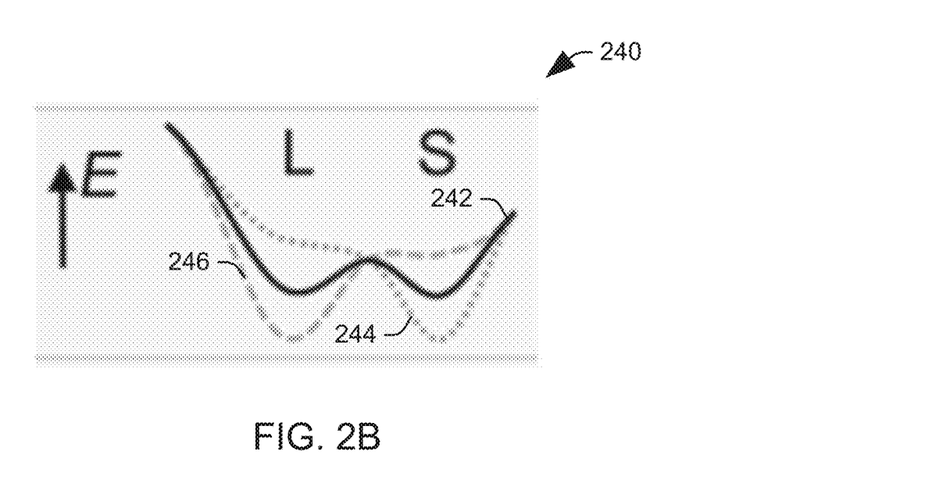
FIG. 2B is a schematic of the energy landscape between the large (L) and small (S) skyrmion states separated by an energy barrier which can be tuned by modifying either or both of an applied magnetic field $H_Z$ and an electric current I.

FIG. 2B is a schematic 240 of the energy landscape 242 between the large (L) and small (S) skyrmion states separated by an energy barrier which can be tuned by modifying either or both of an applied magnetic field $H_Z$ and an electric current I. Energy is illustrated here on the vertical axis. The energy landscape can be tuned by modifying the competing energies which determine the switching probability and fluctuation rate. This is similar to the behavior of binary stochastic neurons as modelled by stochastic MTJs. When the magnetic field has a larger magnitude, or when electric current is applied in a first direction, the energy landscape can be tuned to provide a landscape 244 in which the small state is the lowest energy state. When the magnetic field has a smaller magnitude, or when electric current is applied in a second direction that opposes the first direction, the energy landscape can be tuned to provide a landscape 246 in which the large state is the lowest energy state.

Switching of the skyrmion can be tuned by modifying the competing energies. On the one hand, the perpendicular magnetic field $H_Z$ controls the energy landscape through the Zeeman energy, such that a lower field tends to stabilize the L-state skyrmion while a higher field stabilizes the S-state skyrmion. The field control of this switching is a consequence of the Zeeman-energy variation and can be well fitted to the sigmoidal function. Additionally, the spin current which can be derived from the electric current flowing through the spin Hall material, Ta, is also an effective tool to control the magnetization. The mobile part of the skyrmion tends to move along the direction of the electric current with an additional transverse motion owing to the gyro-force induced by the topology. More specifically, the motion of the mobile part of the skyrmion is determined mainly by the pinning sites and may deviate from the intrinsic skyrmion Hall angle. A transition between the two states occurs as the magnetic field is changed by an amount as small as 0.3 Oe or as the current is changed by an amount as small as 0.25 mA. This suggests that the perpendicular field $H_Z$ and the current I are two highly sensitive control parameters for the switching of a skyrmion which can serve as a robust TRNG.

Figure 2C:
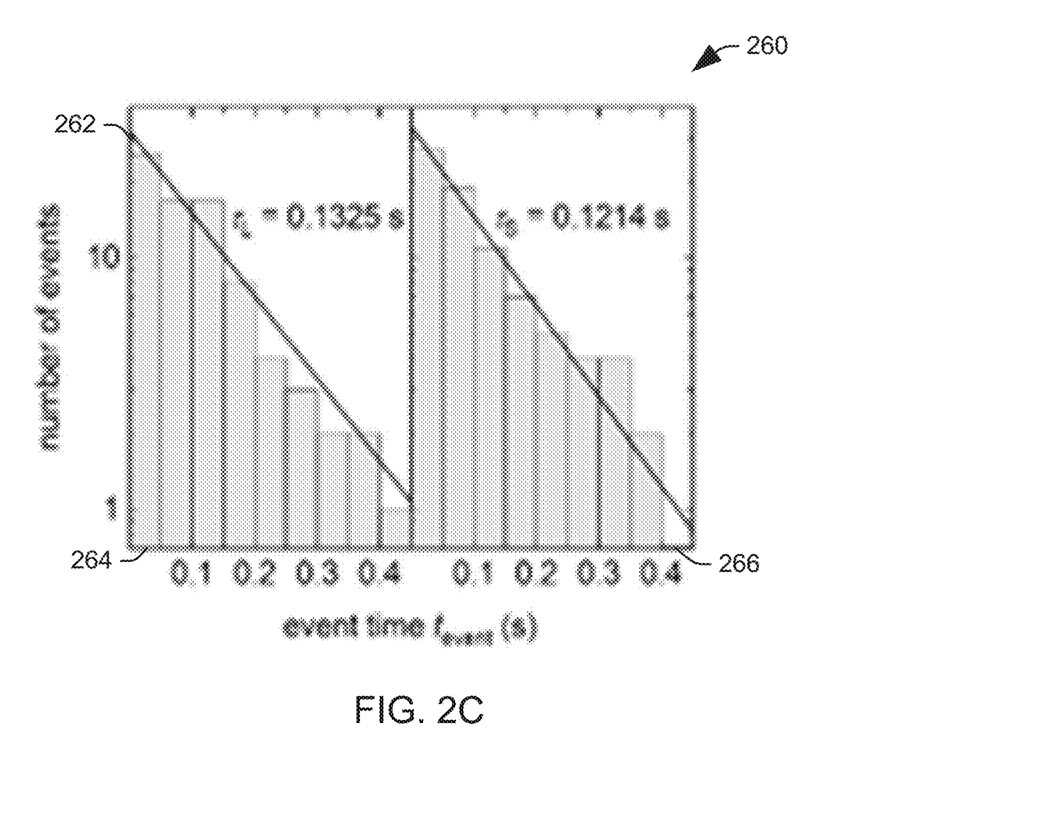
FIG. 2C is a histogram of the residence time for the L and S states.

FIG. 2C is a histogram 260 of the residence time for the L and S states. The vertical axis 262 represents a number of events, a first horizontal axis 264 represents a residence time in the large state, and a second horizontal axis 266 represents a residence time in the small state. The graph 260 was generated from experimental data collected by monitoring signals for twenty-one seconds with an applied magnetic field of 5.75 Oe, an applied current of 0.2 mA, and a temperature of 307.1 K. The lines are exponential fittings from which the average residence times $\tau_L$ and $\tau_S$ are derived. The number of events, N, shows an exponential decay with $t_{event}$, $N \propto e^{-t_{event}/\tau}$. This indicates that the switching event follows a purely random process known as the Poisson process. The geometric mean of these two residence times provides the average residence time $\tau$.

Figure 3:
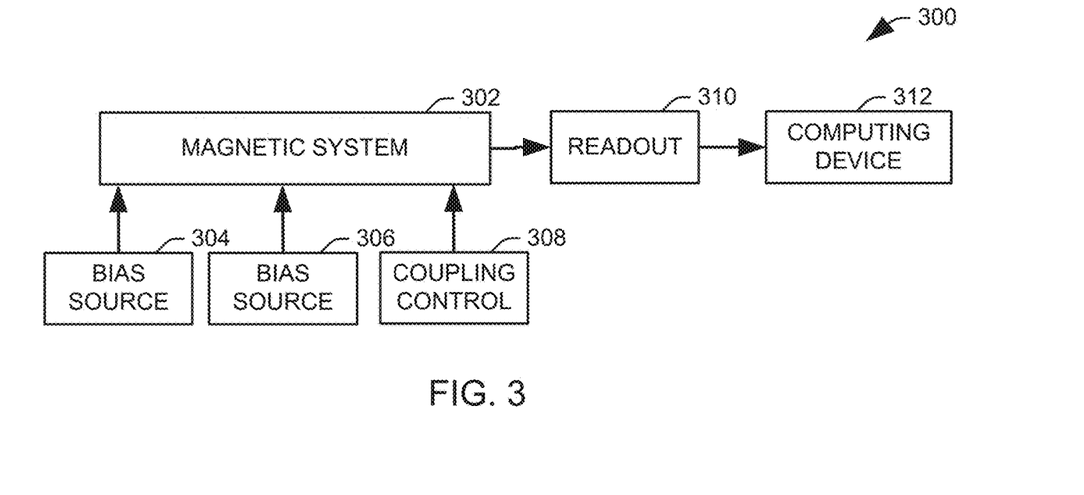
FIG. 3 illustrates a system incorporating multiple skyrmions hosted in a magnetic system such that each of the skyrmions can switch between a plurality of states with a tunable switching probability that is also influenced via coupling with neighboring skyrmions.

An isolated skyrmion can serve as a robust TRNG for probabilistic computing. Both the field and current are efficient parameters to control the switching probability of the probabilistic bit. The stochastic computer has been proven successful in addressing the issues of optimization and invertible logic that Von Neumann computers fail to address efficiently. To this end, FIG. 3 illustrates a system 300 incorporating multiple skyrmions hosted in a magnetic system 302 such that each of the skyrmions can switch between a plurality of states with a tunable switching probability that can be also influenced via coupling with neighboring skyrmions. In various embodiments, the magnetic system 302 can be implemented using one or more of a bulk material, a thin film, or other micro-constricted or nano-constricted structures. Each skyrmion interacts with local pinning centers such that a first pinning center for each skyrmion strongly pins one part of the skyrmion while the other part can fluctuate in time between two or more weaker pinning sites under thermal effects. Depending on the number and positioning of the weaker pinning centers, the fluctuation of each skyrmion can occur between two discrete states, three discrete states, or four or more discrete states. The illustrated implementation 300 assumes that two skyrmions are present, but it will be appreciated that, in some implementations, larger numbers of skyrmions can be hosted in the magnetic system 302. This is particularly true in reservoir computing applications.

Skyrmions can be generated or annihilated within the magnetic system 302 by modifying an applied magnetic field, either uniformly or local to the pinning site, applying an electric current (DC, AC, or RF), applying a voltage (DC, AC, or RF), applying a spin wave, applying a magnon pulse, applying an acoustic wave, using optics or applying photons either uniformly or local to the pinning site, applying a thermal pulse either uniformly or local to the pinning site, applying an gradient of any external stimulus, or via other, similar, controls. Skyrmions induced in the magnetic system 302 can vary in size between one-tenth of a nanometer to one hundred micrometers.

In one implementation, the magnetic system 302 hosts two skyrmions or more that are positioned sufficiently distantly from one another to where the state of each skyrmion is not influenced by the state of another skyrmion. In this instance, each skyrmion can independently produce a random bit, with a switching probability tuned by applied energy. By simultaneously measuring all of the uncorrelated skyrmions, a multi-bit random number can be produced.

In another implementation, the magnetic system hoists two skyrmions separated by about 3 μm from core to core. Interacting with local pinning centers at a moderate field $H_Z$ and current I, the skyrmion pair can fluctuate in time between four discrete states: LL, LS, SL, and SS states. In this notation, the first L or S represents the state of a first skyrmion, and the second L or S represents the state of a second skyrmion. At a constant, moderate field strength and current (e.g., −0.2 mA), the probabilities $p_{SS}$ of being at the SS state, $p_{LS/SL}$ at the LS/SL states and $p_{LL}$ at the LL state can be determined as $p_{LS/SL} \approx 0.70$ and $p_{LL} \approx p_{SS} \approx 0.15$. This indicates the two skyrmions are linked by an anti-correlated coupling in which one skyrmion has an increased probability at the L or S state while the other skyrmion is at the S or L state. In practice, the two skyrmions spend most of the time fluctuating between the LS and SL states. Measuring the local dynamics of the two skyrmions using different currents (0.2 and −0.3 mA) yields similar results. This anti-correlated coupling is most likely mediated by the demagnetization field while the coupling induced by the overlap between spin textures of the two skyrmions is negligible due to their large separation. More specifically, when one skyrmion is at the S or L state, the demagnetization field it generates at the other skyrmion position along the normal direction opposite to the magnetization direction at the skyrmion core would be smaller or larger, leading the other skyrmion to have an increased probability at the L or S state, respectively. In this example, when one skyrmion varies from the S to L state, or vice versa, the demagnetization field it generates at the other skyrmion position along the sample normal direction varies by an amount on the order of −0.3 or 0.3 Oe, respectively. This field variation is comparable to that required for the transition between $p_L \approx 0$ and $p_L \approx 1$ for an isolated skyrmion and correspondingly leads to a higher probability of the other skyrmion to be in the S or L state.

A first bias source 304 provides energy to the magnetic system 302 as to adjust a switching probability associated with one of a plurality of states associated with a first skyrmion. It will be appreciated that a base switching probability of a given skyrmion can be determined, for example, by varying the temperature, modifying the spatial distributions of pinning centers and pinning strengths, modifying a configuration of the skyrmion, or modifying a size of the skyrmion. The first bias source 304 can provide any of an applied magnetic field, a current, a voltage, a magnon wave or pulse, a thermal pulse, a gradient of a stimulus, or similar controls to tune the switching probability associated with a state of the skyrmion to a desired value. In one implementation, the switching probability can be tunable to provide a switching fluctuation rate for the first skyrmion within the range of $10^{-2}$ to $10^{12}$ hertz.

A second bias source 306 provides energy to the magnetic system 302 as to adjust a switching probability associated with one of a plurality of states associated with a second skyrmion. It will be appreciated that the first bias source 306 can share common components with the first bias source 304. The second bias source 306 can tune a base switching probability of the second skyrmion, for example, by varying the temperature, modifying the spatial distributions of pinning centers and pinning strengths, modifying a configuration of the skyrmion, or modifying a size of the skyrmion. The second bias source 306 can provide any of an applied magnetic field, a current, a voltage, a magnon wave or pulse, a thermal pulse, a gradient of a stimulus, or similar controls to tune the switching probability associated with a state of the skyrmion to a desired value.

A coupling control 308 controls a dynamic coupling between the first and second skyrmions. It will be appreciated that, in implementations utilizing more than two skyrmions, the coupling control can control coupling between neighboring skyrmions globally, in specific groups, or individually. A base level of coupling between any two skyrmions can be a function of a distance between the two skyrmions and a size of each of the two skyrmions. Further, the coupling control 308 can utilize any of an applied magnetic field, electric current, voltage, or a magnon wave or pulse, a thermal pulse, or similar controls to adjust the coupling between the two skyrmions. In one implementation, a dynamic coupling strength between neighboring skyrmions can be tuned within the range of zero (fully decoupled) to one (fully coupled) via one of these methods.

In the foregoing, it is assuming that the two skyrmions, independently, have the same field and current dependencies of the probability $\tilde{p}_L$ ($\tilde{p}_S = 1 - \tilde{p}_L$), that when one skyrmion is at the L state, the other skyrmion has an increased probability of $\tilde{p}_S(1+\Delta)$ and a decreased probability of $1-\tilde{p}_S(1+\Delta)$ to be in the S and L states, respectively, and when one skyrmion is at the S state, the other skyrmion has an increased probability of $\tilde{p}_L(1+\Delta)$ and a decreased probability of $1-\tilde{p}_L(1+\Delta)$ to be in the L and S states, respectively. The dimensionless parameter $\Delta$ ranges from 0 to 1 and can be used to characterize the dynamic coupling strength between the two skyrmions. With the above assumptions, $\tilde{p}_L$ and $\Delta$ can be extracted from $p_{SS}=\tilde{p}_S-\tilde{p}_L\tilde{p}_S$ $(1+\Delta)$, $p_{LS/SL}=2\tilde{p}_L\tilde{p}_S(1+\Delta)$ and $p_{LL}=\tilde{p}_L-\tilde{p}_L\tilde{p}_S(1+\Delta)$. At a fixed current, the coupling strength peaks at the middle field and weakens by either increasing or decreasing the field. Because the demagnetization-field variation that results from the fluctuation in skyrmion size is independent of the field and current, a decrease in the A value can be explained by a decrease in the switching-probability sensitivity to the field variation. Contrastingly, both the field dependencies of $\tilde{p}_L$ and A shift to a higher field when decreasing the current, due to the combined effects of the Zeeman-energy variation and spin-orbit torque.

The considerable dynamic coupling between neighboring skyrmions, which has not been observed in other stochastic neurons, results from the high sensitivity of the switching probability of a single skyrmion to the magnetic field $H_z$. Substantial dynamic coupling may exist in a complex skyrmion network with multiple skyrmions. The dynamic coupling between neighboring skyrmions makes skyrmion networks strong candidates for applications in logic devices, reservoir computing and Ising computing devices as discussed below. Efficiently controlling the switching probability and the dynamic coupling strength between neighboring skyrmions using the field and current grants skyrmionic devices high tunability and reliably efficient controllability.

A readout component 310 is configured to measure a state of the skyrmions. The readout component 310 can utilize any of electronic measurement, magnetoresistance measurement, direct magnetic imaging, a spin Seebeck effect, a localized sensor or sensors based on magnetoresistance, spin-polarized tunneling, induction, quantum interference, or other physical mechanisms. The output of the readout component 310 can be provided, for example, as an output voltage for each skyrmion or as imaging contrast in selected regions of an image. In one implementation, readout can be improved by reducing the active sensing area relative to the skyrmion size or increasing the skyrmion-size variation in fluctuation dynamics.

A computing device 312 receives the output of the readout component 310 and performs at least one function based upon the output of the readout component. It will be appreciated that the computing device 312 can be implemented as dedicated hardware, such as an integrated circuit or field programmable gate array, as software instructions executed by a processor with appropriate hardware for receiving the output of the readout device, or as a combination of software and dedicated hardware. The computing device 312 can include, for example, a memory, a logic gate or set of logic gates, a reservoir computing system, an Ising computing system, a neuromorphic computing system, a cryptographic system, a probabilistic computing system, a random number generator, a digital tamperproofing system, or an approximate computing system.

In one implementation, in which each skyrmion is controlled using a local magnetic field or current, two neighboring skyrmions with an anti-correlated coupling can be used to implement logic devices. A localized strain, voltage, spin wave and optics can also be used to control each skyrmion for logic operations. Local magnetic fields can be applied through multiple methods such as through the stray field generated from a magnetized tip or by applying an electric current to a strip patterned nearby the skyrmion locations. The local current can be applied to individual skyrmions through patterning two Hall crosses with each Hall cross hosting one skyrmion. The magnetized tip can be integrated in the device like the read-write head in the hard disk drive. Additionally, advanced patterning techniques such as the e-beam lithography allow us to fabricate nanometer-sized structures, such as the well-defined strip and Hall crosses. The local field or current can serve as inputs that set the probability, $p_L$, that the skyrmion is in the large (L) state as opposed to the small (S) state and the resultant Hall resistance serves as the output and can be detected through electronic measurements. In a logical AND operation, for example, inputs 1 and 0 can be currents for $p_L=1$ and $p_L=0.5$, respectively. When both inputs are 1, both skyrmions are at the L state, which gives a high resistivity of $\langle \Delta p_{xy2} \rangle \approx 0.016$ $\mu\Omega$ cm corresponding to an output of 1. When the input for one skyrmion is 1 and the other is 0, one skyrmion would be stabilized at the L state while the other has an increased probability at the S state, leading to a lower resistivity of $\langle \Delta p_{xy2} \rangle \approx 0.008$ $\mu\Omega$ cm which corresponds to an output of 0. When both inputs are 0, due to their mutual coupling, the two skyrmions are either at the LS or SL state, which also leads to a resistivity of $\langle \Delta p_{xy2} \rangle \approx 0.008$ $\mu\Omega$ cm corresponding to an output of 0.

In a logical OR operation, on the other hand, inputs 1 and 0 can be currents for $P_L=0.5$ and $p_L=0$, respectively. When both inputs are 1, the two skyrmions are either at the LS or SL state, which leads to a resistivity of $\langle \Delta p_{xy2} \rangle \approx 0.008$ $\lambda\Omega$ cm corresponding to an output of 1. When the input for one skyrmion is 0 and the other is 1, one skyrmion would be stabilized at the S state while the other has an increased probability at the L state, leading to a resistivity of $\langle \Delta p_{xy2} \rangle \approx 0.008$ $\mu\Omega$ cm which corresponds to an output of 1, as well. When both inputs are 0, both skyrmions are at the S state, giving a low resistivity of $\langle \Delta p_{xy2} \rangle \approx 0$ corresponding to the output of 0. Therefore, the logical operations can be achieved by local dynamics of two neighboring skyrmions with an anti-correlated coupling. These logic devices based on local dynamics of skyrmions proposed here are much easy to operate and spatially compact. While only AND and OR gates are described herein for the purpose of example, it will be appreciated that additional logic operations based on local dynamics of skyrmions may also be designed by using skyrmions with different local dynamics. Further, in addition to skyrmionic logics, two neighboring skyrmions can serve as an element of a ternary numeral system with three discrete SS, LS/SL and LL states.

Two neighboring skyrmions form the simplest skyrmion network. A more complex skyrmion network has further potential in computing. A skyrmion network in a naturally grown magnetic film can be used as part of a reservoir computing application. The reservoir computing paradigm is inspired by the human brain and is a type of recursive neural network which exhibits capabilities in recognition and prediction of spatio-temporal events. Reservoir computing does not require any knowledge of the node weights for training purposes, only the output weights, and can thus utilize a naturally existing skyrmion network in magnetic films.

Figure 4:
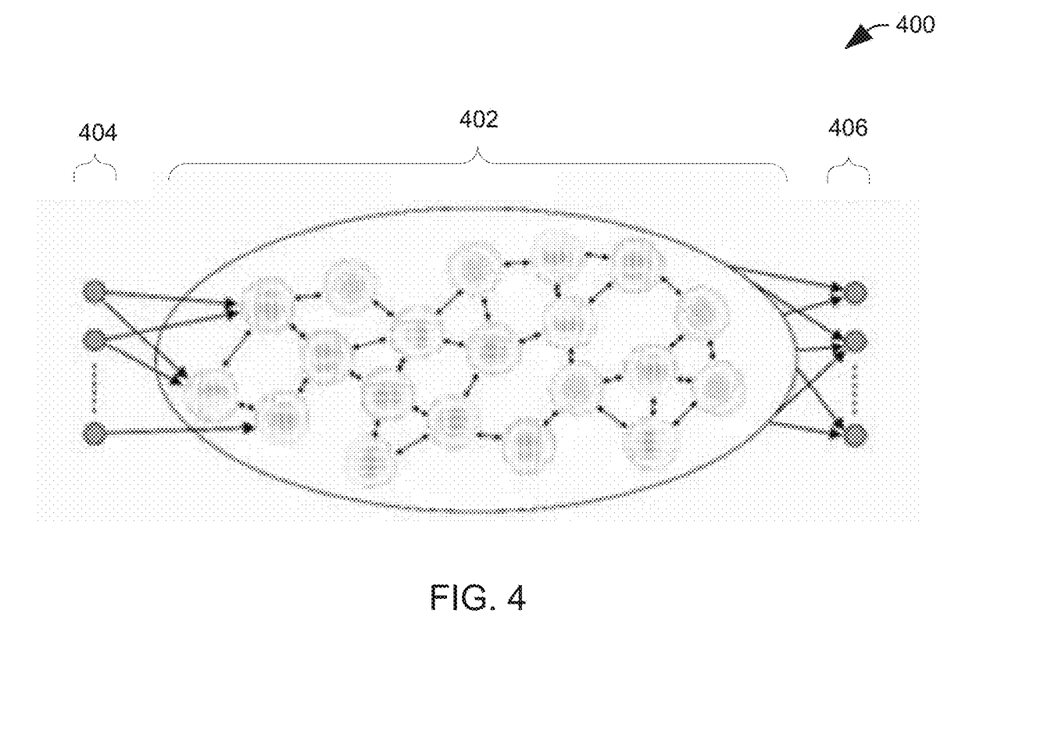
FIG. 4 illustrates a skyrmion network-based reservoir computing system.

FIG. 4 illustrates a skyrmion network-based reservoir computing system 400. In the illustrated system 400, applied fields or currents in particular regions of a skyrmion network 402 serve as an input layer 404 for the network. Local magnetic fields can be in principle applied by multiple "monopole" writing elements and the local current can be applied through multiple nanocontacts. The skyrmion network 402 with mutual interactions is the reservoir whose weighting function can be unknown, and the matrix of the node weights is generally fixed for reservoir computing. In the illustrated system 400, a fixed matrix is generated under a given global field and current. When the field or current is varied, the matrix changes and a new reservoir computer is formed, thereby allowing the skyrmion network to have higher tunability and functionality compared to existing networks. Electronic signals from selected regions can then be converted into output neurons 406. In addition to naturally existing skyrmion networks, skyrmion lattices with different structures can also be implemented via artificial pinning centers. These may exhibit more interesting dynamics for potential in computing applications such as Ising computing. Overall, local dynamics of skyrmions may provide effective functionalities for versatile computing.

Figure 5:
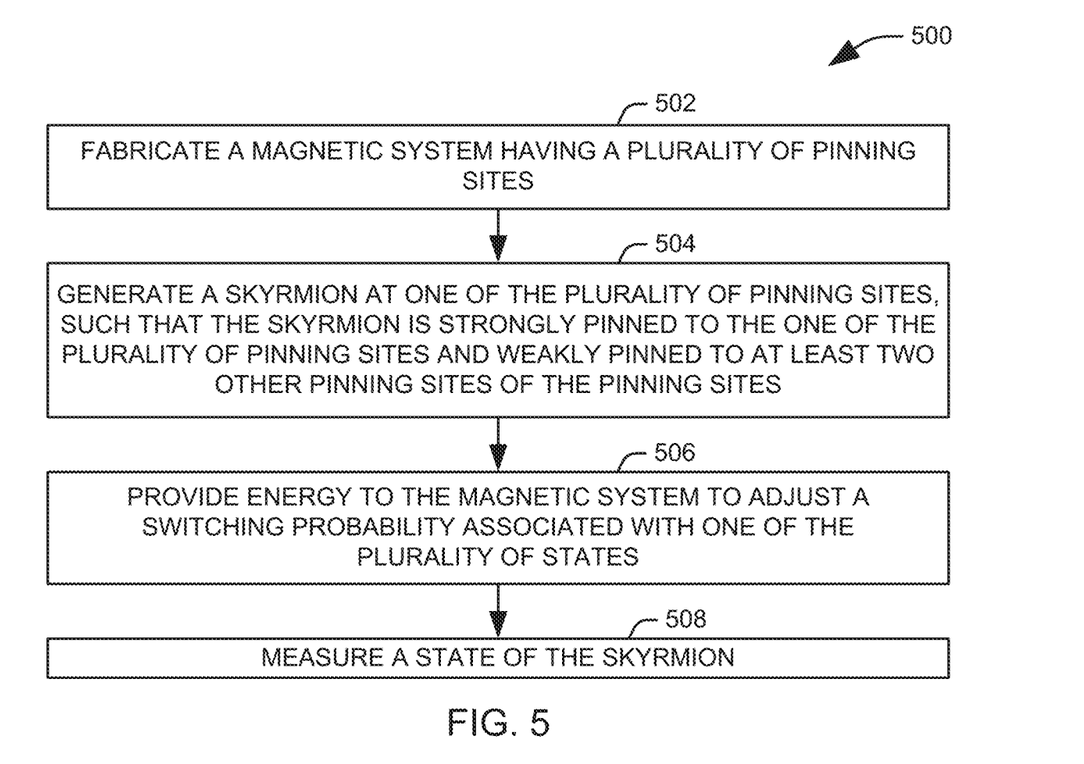
FIG. 5 illustrates a method for employing local dynamics of skyrmions for computing operations.

In view of the foregoing structural and functional features described above, an example method will be better appreciated with reference to FIG. 5. While, for purposes of simplicity of explanation, the example method of FIG. 5 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method in accordance with the invention.

FIG. 5 illustrates a method 500 for employing local dynamics of skyrmions for computing operations. At 502, a magnetic system having a plurality of pinning sites is fabricated. The magnetic system can be generated, for example, as a bulk material, a thin film, or a magnetic multilayer. In one implementation, the magnetic system is generated by depositing a magnetic multilayer. In one example, a deposition rate of the deposition process can be controlled to manipulate the naturally existing pinning sites. In another implementation, one or more holes or embedding impurity atoms can be introduced into the magnetic multilayer to generate pinning sites.

At 504, a skyrmion is generated at one of the plurality of pinning sites, such that the skyrmion is strongly pinned to the one of the plurality of pinning sites and weakly pinned to at least two other pinning sites of the pinning sites. The resulting skyrmion transitions among a set of a plurality of states, each of the plurality of states being associated with one of the at least two other pinning sites and having an associated switching probability. In one implementation, the skyrmion can be implemented by either modifying a magnetic field applied to the one of the plurality of pinning sites, applying an electric current to the one of the plurality of pinning sites, applying a thermal pulse to the one of the plurality of pinning sites, applying an optic pulse to the one of the plurality of pinning sites, applying a magnon pulse to the one of the plurality of pinning sites, or applying a voltage pulse to the one of the plurality of pinning sites. A size of the generated skyrmion can be selected to provide a specific base switching probability for at least one of the plurality of states associated with the skyrmion. In some implementations, a plurality of skyrmions are generated and energy is applied to the magnetic system to annihilate one of the plurality of skyrmions. In another example, a plurality of skyrmions, each associated with a set of the plurality of pinning sites are generated in two positions on the magnetic system to allow for the first skyrmion to be coupled to the second skyrmion in an anti-correlated manner. This coupling can be tuned by providing energy to the magnetic system.

At 506, energy is provided to the magnetic system as to adjust a switching probability associated with one of the plurality of states. It will be appreciated that the provided energy can be any of thermal energy, current, an applied magnetic field, or other appropriate energy. At 508, a state of the skyrmion is measured. This state can be represented as a current or a voltage and provided to a computing system for use in an appropriate computing function.

Figure 6:
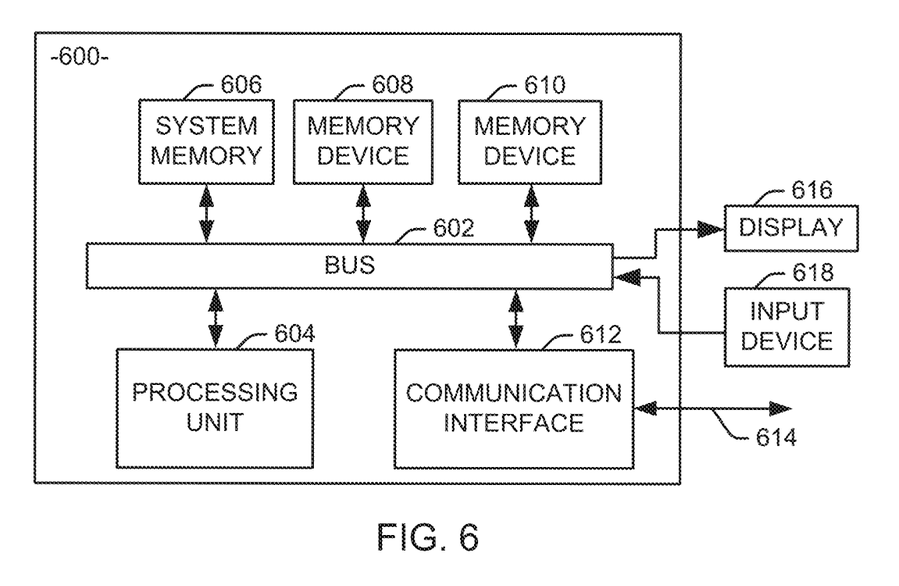
FIG. 6 is a schematic block diagram illustrating an exemplary system of hardware components capable of implementing examples of the systems and methods disclosed in FIGS. 1-5, such as the computing device illustrated in FIG. 1.

FIG. 6 is a schematic block diagram illustrating an exemplary system 600 of hardware components capable of implementing examples of the systems and methods disclosed in FIGS. 1-5, such as the computing device 108 illustrated in FIG. 1. The system 600 can include various systems and subsystems. The system 600 can be any of personal computer, a laptop computer, a workstation, a computer system, an appliance, an application-specific integrated circuit (ASIC), a server, a server blade center, or a server farm.

The system 600 can includes a system bus 602, a processing unit 604, a system memory 606, memory devices 608 and 610, a communication interface 612 (e.g., a network interface), a communication link 614, a display 616 (e.g., a video screen), and an input device 618 (e.g., a keyboard and/or a mouse). The system bus 602 can be in communication with the processing unit 604 and the system memory 606. The additional memory devices 608 and 610, such as a hard disk drive, server, stand-alone database, or other non-volatile memory, can also be in communication with the system bus 602. The system bus 602 interconnects the processing unit 604, the memory devices 606-610, the communication interface 612, the display 616, and the input device 618. In some examples, the system bus 602 also interconnects an additional port (not shown), such as a universal serial bus (USB) port.

The system 600 could be implemented in a computing cloud. In such a situation, features of the system 600, such as the processing unit 604, the communication interface 612, and the memory devices 608 and 610 could be representative of a single instance of hardware or multiple instances of hardware with applications executing across the multiple of instances (i.e., distributed) of hardware (e.g., computers, routers, memory, processors, or a combination thereof). Alternatively, the system 600 could be implemented on a single dedicated server.

The processing unit 604 can be a computing device and can include an application-specific integrated circuit (ASIC). The processing unit 604 executes a set of instructions to implement the operations of examples disclosed herein. The processing unit can include a processing core.

The additional memory devices 606, 608, and 610 can store data, programs, instructions, database queries in text or compiled form, and any other information that can be needed to operate a computer. The memories 606, 608 and 610 can be implemented as computer-readable media (integrated or removable) such as a memory card, disk drive, compact disk (CD), or server accessible over a network. In certain examples, the memories 606, 608 and 610 can comprise text, images, video, and/or audio, portions of which can be available in formats comprehensible to human beings.

Additionally or alternatively, the system 600 can access an external data source or query source through the communication interface 612, which can communicate with the system bus 602 and the communication link 614.

In operation, the system 600 can be used to implement one or more parts of a system in accordance with the present invention. Computer executable logic for implementing the quality assurance system resides on one or more of the system memory 606, and the memory devices 608, 610 in accordance with certain examples. The processing unit 604 executes one or more computer executable instructions originating from the system memory 606 and the memory devices 608 and 610. It will be appreciated that a computer readable medium can include multiple computer readable media each operatively connected to the processing unit.

Specific details are given in the above description to provide a thorough understanding of the embodiments. However, it is understood that the embodiments can be practiced without these specific details. For example, circuits can be shown in block diagrams in order not to obscure the embodiments in unnecessary detail. In other instances, well-known circuits, processes, algorithms, structures, and techniques can be shown without unnecessary detail in order to avoid obscuring the embodiments.

Implementation of the techniques, blocks, steps, and means described above can be done in various ways. For example, these techniques, blocks, steps, and means can be implemented in hardware, software, or a combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments can be described as a process which is depicted as a flowchart, a flow diagram, a data flow diagram, a structure diagram, or a block diagram. Although a flowchart can describe the operations as a sequential process, many of the operations can be performed in parallel or concurrently. In addition, the order of the operations can be re-arranged. A process is terminated when its operations are completed, but could have additional steps not included in the figure. A process can correspond to a method, a function, a procedure, a subroutine, a subprogram, etc. When a process corresponds to a function, its termination corresponds to a return of the function to the calling function or the main function.

Furthermore, embodiments can be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks can be stored in a machine-readable medium such as a storage medium. A code segment or machine-executable instruction can represent a procedure, a function, a subprogram, a program, a routine, a subroutine, a module, a software package, a script, a class, or any combination of instructions, data structures, and/or program statements. A code segment can be coupled to another code segment or a hardware circuit by passing and/or receiving information, data, arguments, parameters, and/or memory contents. Information, arguments, parameters, data, etc. can be passed, forwarded, or transmitted via any suitable means including memory sharing, message passing, ticket passing, network transmission, etc.

For a firmware and/or software implementation, the methodologies can be implemented with modules (e.g., procedures, functions, and so on) that perform the functions described herein. Any machine-readable medium tangibly embodying instructions can be used in implementing the methodologies described herein. For example, software codes can be stored in a memory. Memory can be implemented within the processor or external to the processor. As used herein the term "memory" refers to any type of long term, short term, and volatile, nonvolatile, or other storage medium and is not to be limited to any particular type of memory or number of memories, or type of media upon which memory is stored.

Moreover, as disclosed herein, the term "storage medium" can represent one or more memories for storing data, including read only memory (ROM), random access memory (RAM), magnetic RAM, core memory, magnetic disk storage mediums, optical storage mediums, flash memory devices and/or other machine-readable mediums for storing information. The terms "computer readable medium" and "machine readable medium" includes, but is not limited to portable or fixed storage devices, optical storage devices, wireless channels, and/or various other storage mediums capable of storing that contain or carry instruction(s) and/or data. It will be appreciated that a "computer readable medium" or "machine readable medium" can include multiple media each operatively connected to a processing unit.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

In view of the foregoing, the following is claimed:

1. A system comprising:
a magnetic system hosting a skyrmion, the skyrmion transitioning among a plurality of states, each of the plurality of states having an associated switching probability;
a bias source that provides energy to the magnetic system as to adjust a switching probability associated with one of the plurality of states;
a readout component for measuring a state of the skyrmion;
a computing component that generates a random bit from the state of the skyrmion measured at the readout component.

2. The system of claim 1, wherein the skyrmion is a first skyrmion of a plurality of skyrmions, the bias source is a first bias source, and the magnetic system hosts the first skyrmion and a second skyrmion of the plurality of skyrmions, the system further comprising:
a second bias source that provides energy to the magnetic system as to adjust a switching probability associated with one of a plurality of states of the second skyrmion; and
a coupling control that tunes a dynamic coupling between the first and second skyrmions.

3. The system of claim 2, wherein each of the first skyrmion and the second skyrmion is implemented on a Hall cross, and the readout component measures a Hall resistance representing a state of a system formed by the two skyrmions.

4. The system of claim 3, wherein a value for the measured Hall resistance represents one of a logical OR operation and a logical AND operation on an input provided by the first bias source and an input provided by the second bias source.

5. The system of claim 1, wherein the bias source comprises one of an electromagnetic source, a current source, a heating element, an optic source, a spin wave source, and a voltage source.

6. The system of claim 1, wherein the magnetic system is implemented as one of a magnetic multilayer, a bulk magnetic material, and a thin film.

7. The system of claim 1, wherein the magnetic system includes a first pinning site associated with the skyrmion and at least two additional pinning sites, in which each of the plurality of states are represented by one of the at least two additional pinning sites.

8. The system of claim 1, wherein the plurality of states includes more than two states, and the computing component generates at least two random bits from the state of the skyrmion measured at the readout component.

9. The system of claim 1, wherein the skyrmion is a first skyrmion of a plurality of skyrmions, the bias source is a first bias source, and the magnetic system hosts the first skyrmion and a second skyrmion of the plurality of skyrmions, the system further comprising a second bias source that provides energy to the magnetic system as to adjust a switching probability associated with one of a plurality of states of the second skyrmion, and the readout component measuring a state of each of the first skyrmion and the second skyrmion, the measured state of each skyrmion being used to generate a random bit.

10. A method comprising:
fabricating a magnetic system having a plurality of pinning sites;
generating a skyrmion at one of the plurality of pinning sites, the skyrmion being generated as to be strongly pinned to the one of the plurality of pinning sites and weakly pinned to at least two other pinning sites of the pinning sites, with the skyrmion transitioning among a set of a plurality of states, each of the plurality of states being associated with one of the at least two other pinning sites and having an associated switching probability;
providing energy to the magnetic system as to adjust a switching probability associated with one of the plurality of states; and
measuring a state of the skyrmion of the plurality of states.

11. The method of claim 10, wherein fabricating the magnetic system comprises depositing a magnetic multilayer.

12. The method of claim 11, wherein deposition rate of the deposition process is controlled to manipulate pinning strengths of naturally-existing pinning sites.

13. The method of claim 11, wherein fabricating the magnetic system having the plurality of pinning sites comprises introducing a hole or embedding impurity atoms into the magnetic multilayer.

14. The method of claim 10, wherein generating a skyrmion at one of the plurality of pinning sites comprises one of modifying a magnetic field applied to the one of the plurality of pinning sites, applying an electric current to the one of the plurality of pinning sites, applying a thermal pulse to the one of the plurality of pinning sites, applying an optic pulse to the one of the plurality of pinning sites, applying a magnon pulse to the one of the plurality of pinning sites, and applying a voltage pulse to the one of the plurality of pinning sites.

15. The method of claim 10, wherein generating a skyrmion at one of the plurality of pinning sites comprises generating a plurality of skyrmions and applying energy to the magnetic system to annihilate one of the plurality of skyrmions.

16. The method of claim 10, wherein providing energy to the magnetic system as to adjust the switching probability associated with one of the plurality of states comprises providing one of an applied magnetic field, a current, thermal energy, optics, a magnon pulse, and voltages to the magnetic system.

17. The method of claim 10, wherein generating the skyrmion at the one of the plurality of pinning sites comprises generating a plurality of skyrmions, each associated with a set of the plurality of pinning sites, wherein respective positions of at least a first skyrmion of the plurality of skyrmion and a second skyrmion of the plurality of skyrmion in the magnetic system are selected such that the first skyrmion is coupled to the second skyrmion in an anti-correlated manner.

18. The method of claim 17, further comprising providing energy to the magnetic system to tune the anti-correlated coupling between the first skyrmion and the second skyrmion.

19. The method of claim 10, wherein generating the skyrmion at the one of the plurality of pinning sites comprises generating the skyrmion at the one of the plurality of pinning sites with a size selected to provide a specific base switching probability for at least one of the plurality of states associated with the skyrmion.

20. A system comprising:
a magnetic system hosting a plurality of skyrmions, each skyrmion transitioning among a plurality of states, each of the plurality of states having an associated switching probability, wherein each skyrmion is coupled to its neighboring skyrmions in their fluctuating dynamics;

a bias source that provides energy to a first subset of the plurality of skyrmions as to adjust a switching probability associated with at least one of the first subset of the plurality of skyrmions; and a readout component for measuring a state of a second subset of the plurality of skyrmions.

21. The system of claim 20, wherein the union of the first subset of skyrmions and the second subset of skyrmions is a proper subset of the plurality of skyrmions.

* * * * *